(12) United States Patent  
Fukutome

(10) Patent No.: US 8,896,345 B2  
(45) Date of Patent: Nov. 25, 2014

(54) SEMICONDUCTOR DEVICE

(71) Applicant: Semiconductor Energy Laboratory Co., Ltd., Atsugi (JP)

(72) Inventor: Takahiro Fukutome, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 23 days.

(21) Appl. No.: 13/872,469

(22) Filed: Apr. 29, 2013

(65) Prior Publication Data

US 2013/0285698 A1  Oct. 31, 2013

(30) Foreign Application Priority Data

Apr. 30, 2012  (JP) ................. 2012-104282

(51) Int. Cl.
- *H03K 19/173* (2006.01)
- *G06F 7/38* (2006.01)
- *H03K 19/177* (2006.01)
- *H03K 19/00* (2006.01)

(52) U.S. Cl.
CPC ...... *H03K 19/0008* (2013.01); *H03K 19/17784* (2013.01); *H03K 19/17756* (2013.01)
USPC .............. 326/38; 326/39; 326/41; 326/47

(58) Field of Classification Search
USPC ............................. 326/38–41, 47
See application file for complete search history.

(56) References Cited

U.S. PATENT DOCUMENTS

| | | | |
|---|---|---|---|
| 5,379,382 A * | 1/1995 | Work et al. ............... | 710/63 |
| 5,646,544 A * | 7/1997 | Iadanza .................. | 326/38 |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |

(Continued)

FOREIGN PATENT DOCUMENTS

| EP | 1 737 044 A1 | 12/2006 |
|---|---|---|
| EP | 2 226 847 A2 | 9/2010 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Anh Tran  
(74) *Attorney, Agent, or Firm* — Fish & Richardson P.C.

(57) ABSTRACT

A semiconductor device including a PLD which can increase the execution speed of an application with low power consumption is provided. The semiconductor device includes a programmable logic device and a processor which is not dynamically reconfigured. A memory element of the programmable logic device stores a plurality of pieces of configuration data determined to have high frequency of use by a memory module among configuration data corresponding to a thread. The memory element includes a storage element and a switch in each of a plurality of memory cells. The switch is used for supplying charge whose amount is determined by the plurality of pieces of stored configuration data to the storage element, retaining the charge in the storage element, and discharging the charge from the storage element.

8 Claims, 14 Drawing Sheets

(56) References Cited

U.S. PATENT DOCUMENTS

| | | | |
|---|---|---|---|
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,085,858 B1* | 8/2006 | Fox et al. | 710/13 |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0175646 A1 | 7/2011 | Takemura et al. | |
| 2012/0212995 A1 | 8/2012 | Kurokawa | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2000-252814 A | 9/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.—"15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

(56) References Cited

OTHER PUBLICATIONS

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTER," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] At Temperatures Over 1000°C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

(56) References Cited

OTHER PUBLICATIONS

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350°C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector with Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTs With a Novel Passivation Layer," SID Digest '09 : SID International Symposium Digest of Technical Papers, May 31, 2009, pp. 284-287.

\* cited by examiner

FIG. 4A

103 MEMORY DEVICE

| 104 APPLICATION | 105 CONFIGURATION DATA |
| | 105 CONFIGURATION DATA |
| 104 APPLICATION | 105 CONFIGURATION DATA |
| | 105 CONFIGURATION DATA |
| 104 APPLICATION | 105 CONFIGURATION DATA |
| | 105 CONFIGURATION DATA |
| ⋮ | ⋮ |
| 104 APPLICATION | 105 CONFIGURATION DATA |
| | 105 CONFIGURATION DATA |

FIG. 4B

103 MEMORY DEVICE

| 104 APPLICATION | 105 CONFIGURATION DATA |
| | 105 CONFIGURATION DATA |
| 104 APPLICATION | |
| 104 APPLICATION | 105 CONFIGURATION DATA |
| ⋮ | ⋮ |
| 104 APPLICATION | 105 CONFIGURATION DATA |
| | 105 CONFIGURATION DATA |
| 104 APPLICATION | |

FIG. 4C

103 MEMORY DEVICE

| 104 APPLICATION | 105 CONFIGURATION DATA |
| 104 APPLICATION | 105 CONFIGURATION DATA |
| ⋮ | ⋮ |
| 104 APPLICATION | 105 CONFIGURATION DATA |
| 104 APPLICATION | 105 CONFIGURATION DATA |

SEMICONDUCTOR DEVICE

BACKGROUND OF THE INVENTION

1. Field of the Invention

The present invention relates to a semiconductor device including a programmable logic device which can change a configuration of hardware.

2. Description of the Related Art

Smaller and lighter mobile information terminals such as PDAs and smartphones are highly required by users; thus, the scale of hardware that can be built in the limited space in a housing is limited. However, the mobile information terminals are required to have a number of functions, for example, functions of playing moving images, supporting online games, recognizing voice, and capturing images using a miniature camera, so that a plurality of application programs (hereinafter, referred to as applications) needs to be executed using the hardware. The larger the number of applications to be executed is and the smaller the scale of the hardware is, the smaller the storage area which can be secured in a buffer storage device is. This causes the data transfer speed to be a bottleneck; thus, it becomes difficult to reduce the time required to execute a thread and execute an application.

In view of the above, a technique in which a programmable logic device (PLD) is used as part of hardware and some of a plurality of threads executed in an application are executed by hardware in the PLD has been devised as one solution. In a PLD, functions of logic elements (basic blocks) with adequate scale and a connection structure between the logic elements can be changed after manufacture to configure a desired logic circuit. With such a technique, the number of threads executed in an application can be reduced and the execution speed of an application can be increased even when the scale of hardware is limited.

Patent Document 1 below discloses an information processing system in which processing time is reduced in such a manner that a plurality of hardware modules performing the same processing is stored in a storage unit and a hardware module that fits a region where a programmable logic circuit can be configured is preferentially used when data is partly rewritten.

REFERENCE

Patent Document

[Patent Document 1] Japanese Published Patent Application No. 2000-252814

SUMMARY OF THE INVENTION

A PLD includes a storage device (memory element) for storing data (configuration data) on a function of each logic element and a connection structure between the logic elements. In hardware including the PLD, configuration data in the PLD used for an application needs to be transferred, together with the application, from a main memory, a cache, an external storage device, or the like to the memory element when the application is executed.

The configuration data is transferred by a processor whose circuit configuration is not dynamically reconfigured but fixed and which is included in the hardware, or by a direct memory access controller (DMAC). However, in the case where configuration data is transferred by a processor, a variety of operations being executed by the processor must be stopped. In addition, in the case where configuration data is transferred by a DMAC, transmission of other data needed for operation of the processor is interrupted, so that the operation of the processor is delayed.

As the memory element, a storage device such as an SRAM, a DRAM, or an EEPROM is generally used. However, an SRAM not only consumes power in an operating state but also consumes more than a little power in a non-operating state because of an off-state current of a transistor, and an DRAM consumes power by a refresh operation; thus, it is difficult for the memory element to consume less power. Further, an SRAM and a DRAM cannot retain data when supply of power supply voltage is stopped and thus cannot be used for driving with low power consumption, for example, for normally-off computing. In addition, although an EEPROM is nonvolatile, writing speed of data is slow, so that it is difficult to reduce the time required for configuration of the PLD, which contributes to prevention of high-speed execution of an application.

In view of the foregoing technical background, an object of one embodiment of the present invention is to provide a semiconductor device including a PLD which can increase the execution speed of an application. Another object of one embodiment of the present invention is to provide a semiconductor device including a PLD which can increase the execution speed of an application with low power consumption.

In one embodiment of the present invention, each memory cell in a memory element includes a storage element and a switch for supplying charge whose amount is determined by configuration data to the storage element, retaining the charge in the storage element, and discharging the charge from the storage element. Further, in one embodiment of the present invention, the switch includes a transistor having a low off-state current. The transistor includes, in a channel formation region, a semiconductor whose band gap is wider than that of silicon and whose intrinsic carrier density is lower than that of silicon. As such a semiconductor, for example, an oxide semiconductor, silicon carbide, gallium nitride, gallium oxide, and the like each have a band gap greater than or equal to twice the band gap of silicon can be given. A transistor including the semiconductor can have a much lower off-state current than a transistor including a normal semiconductor such as silicon or germanium. Thus, the use of the transistor having the above structure as a switch for retaining charge which flows into the storage element makes it possible to prevent leakage of current from the storage element.

Accordingly, the memory element having the above configuration does not consume power because of the off-state current of the transistor as in an SRAM. Further, power consumed by refresh operation can be significantly reduced as compared with a DRAM by a reduction in frequency of refresh operation. In addition, the time required to write data can be short as compared with an EEPROM, so that the time required for configuration of the PLD can be reduced and the application can be executed at high speed.

Further, a semiconductor device of one embodiment of the present invention includes, in addition to the programmable logic device (PLD), a processor which is not dynamically reconfigured. At least one of a plurality of threads included in the application is executed in a logic circuit including the PLD and the other threads are executed using the processor.

In one embodiment of the present invention, the memory element includes a storage area where a plurality of pieces of configuration data can be stored. Writing of the configuration data to the storage area is controlled by a memory module included in the PLD. Specifically, the memory module has a function of identifying configuration data stored in the memory element and a function of counting the number of times the identified configuration data is written to the logic element for each configuration data. In addition, the PLD includes a storage device for storing a configuration data identifier and the number of times of writing which is counted using each identifier.

The memory module having the above configuration enables configuration data whose number of times of writing to the logic element is large to be preferentially stored in the memory element. Thus, in one embodiment of the present invention, configuration data that is expected to have high frequency of use can be stored in the memory element to reduce the time required to execute an application with high frequency of use. Further, the amount of data transferred from a main memory, a buffer storage device, an external storage device, or the like to the memory element can be small, which enables a delay in processing the processor due to data transfer, which is a bottleneck, to be prevented even when a plurality of applications is executed.

Specifically, a semiconductor device of one embodiment of the present invention includes a storage device, a processor, and a programmable logic device. In the storage device, a plurality of application programs and a plurality of pieces of configuration data which is related to the application programs are stored. The processor has a function of executing a first thread included in the plurality of application programs. The programmable logic device includes a memory module, a memory element, and a plurality of logic elements. The memory element can store a plurality of pieces of configuration data selected from the above plurality of pieces of configuration data by the memory module. The plurality of logic elements defines a logic circuit in accordance with the plurality of pieces of configuration data stored in the memory element. The logic circuit executes a second thread included in the plurality of application programs. The memory module has a function of counting the number of times the plurality of pieces of configuration data is used to define the logic circuit configured with the logic element, and a function of selecting the plurality of pieces of configuration data in accordance with the number of times. The memory element includes a storage element and a switch in each of a plurality of memory cells. The switch is used for supplying charge whose amount is determined by the plurality of pieces of stored configuration data to the storage element, retaining the charge in the storage element, and discharging the charge from the storage element.

One embodiment of the present invention can provide a semiconductor device including a PLD which can increase the execution speed of an application. One embodiment of the present invention can provide a semiconductor device including a PLD which can increase the execution speed of an application with low power consumption.

BRIEF DESCRIPTION OF THE DRAWINGS

FIGS. 4A to 4C each illustrate a data structure in a storage device.

DETAILED DESCRIPTION OF THE INVENTION

Embodiments of the present invention will be hereinafter described in detail with reference to the accompanying drawings. Note that the present invention is not limited to the following description, and it is easily understood by those skilled in the art that the mode and details can be variously changed without departing from the scope and spirit of the present invention. Accordingly, the present invention should not be construed as being limited to the description of the embodiments below.

Note that a semiconductor device of the present invention includes, in its category, various semiconductor integrated circuits formed using semiconductor elements, such as microprocessors, image processing circuits, controllers for semiconductor display devices, digital signal processors (DSPs), micro controllers, and the like. In addition, the semiconductor device of the present invention also includes, in its category, various devices formed using the above semiconductor integrated circuits, such as RF tags, semiconductor display devices, and the like. The semiconductor display devices include, in its category, liquid crystal display devices, light-emitting devices in which a light-emitting element typified by an organic light-emitting element (OLED) is provided for each pixel, electronic paper, digital micromirror devices (DMDs), plasma display panels (PDPs), field emission displays (FEDs), and other semiconductor display devices in which a semiconductor element is included in a driver circuit.

Embodiment 1

Figure 1:
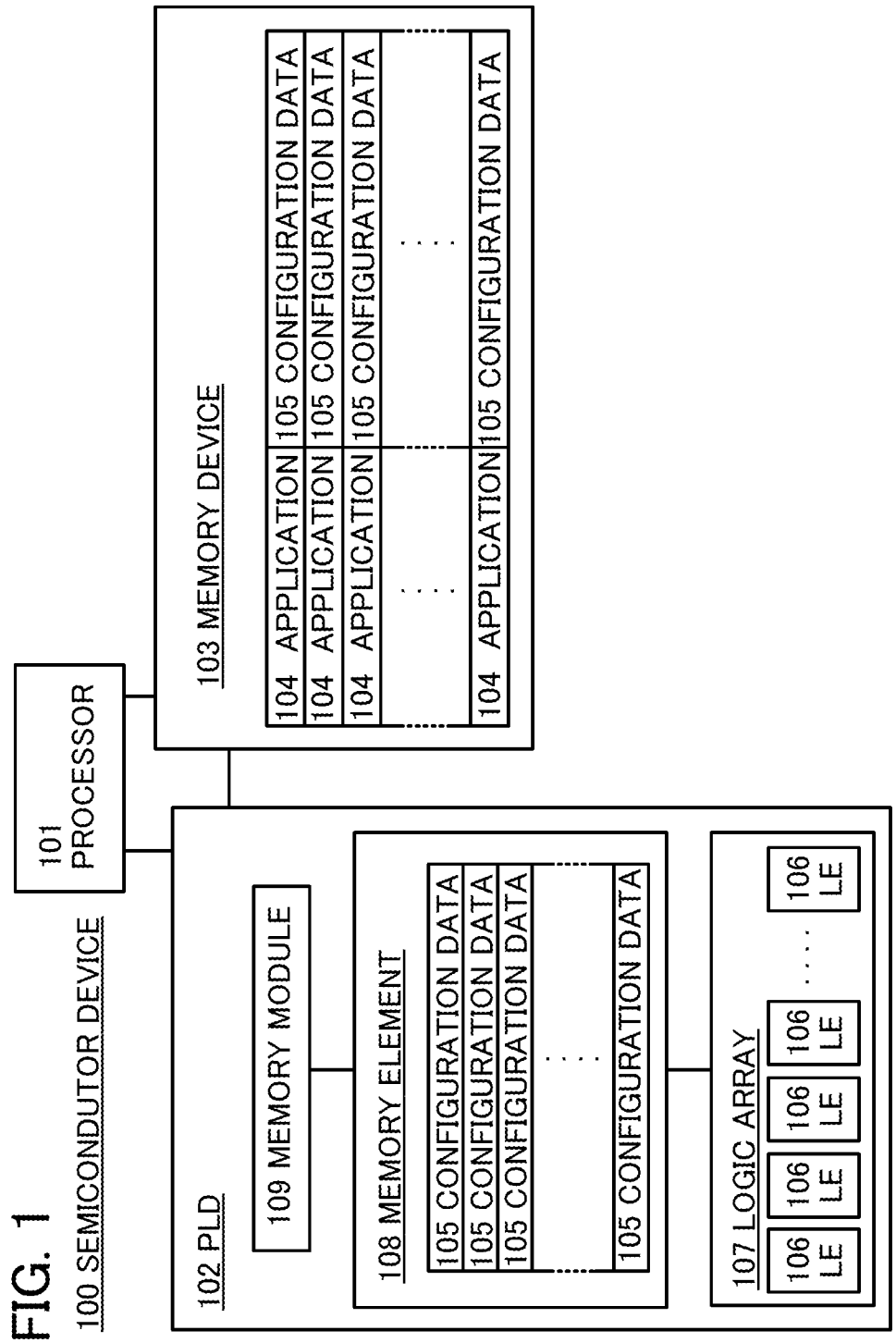
FIG. 1 illustrates a configuration of a semiconductor device.

FIG. 1 is a block diagram illustrating a configuration example of a semiconductor device 100 of one embodiment of the present invention. Note that in a block diagram in this specification, circuits are classified in accordance with their functions and illustrated as independent blocks. However, it is difficult to classify actual circuits according to their functions completely and it is possible for one circuit to have a plurality of functions.

The semiconductor device 100 illustrated in FIG. 1 includes a processor 101, a PLD 102, and a storage device 103. The circuit configuration of the processor 101 is fixed and is not dynamically reconfigured. The circuit configuration of the PLD 102 is not fixed and can be dynamically reconfigured.

The storage device 103 is nonvolatile and a plurality of applications 104 executed by the processor 101 and a plurality of pieces of configuration data 105 related to respective applications 104 are stored in the storage device 103. As the storage device 103, an external storage device (also referred to as an auxiliary storage device) such as a flash memory or a hard disk drive can be used, for example.

The processor 101 reads the application 104 stored in the storage device 103 and executes the application 104. Specifically, the application 104 includes one or more threads and the processor 101 decodes and executes an instruction included in the thread, whereby the application 104 is executed. The processor 101 can request the PLD 102 to execute any one or more of the threads included in the application 104.

The PLD 102 includes a logic array 107 having a plurality of logic elements (LEs) 106, a memory element 108, and a memory module 109. The memory element 108 can store a plurality of pieces of the configuration data 105 selected by the memory module 109 from a plurality of pieces of the configuration data 105 stored in the storage device 103.

The LEs 106 included in the logic array 107 define a logic circuit in accordance with the configuration data 105 stored in the memory element 108. In other words, the LEs 106 can be regarded as a logic elements which deine logic operation being performed, that is, a combination of an input value and an output value, in accordance with the configuration data 105. The logic operation being performed is defined by the LEs 106 in accordance with the configuration data 105, whereby the definition (also referred to as configuration) of a logic circuit configured in the logic array 107 is given.

When the processor 101 requests the PLD 102 to execute a thread, a logic circuit is defined in the logic array 107 in accordance with the configuration data 105 which corresponds to the thread and is stored in the memory element 108. In the case where the configuration data 105 corresponding to the thread is not stored in the memory element 108, the configuration data 105 is transferred from the storage device 103 to the memory element 108 using DMA transfer or through the processor 101. Note that in the case where the configuration data 105 corresponding to the thread is stored in a storage device included in the processor 101, such as a main memory or a buffer storage device, the configuration data 105 is transferred from the storage device included in the processor 101 to the memory element 108. The processor 101 can execute the application 104 using data obtained by execution of the thread in the PLD 102.

The memory module 109 has a function of controlling writing of the configuration data 105 to a storage area included in the memory element 108. Specifically, the memory module 109 has a function of identifying the configuration data 105 stored in the memory element 108 and a function of counting the number of times each identified configuration data 105 is written to the logic array 107.

The configuration data 105 can be identified using an identifier included in the configuration data 105. The PLD 102 has a function of storing the identifier of the configuration data 105 and information about a status of use of the configuration data 105 obtained from each identifier as management information. As the information about a status of use, data such as the number of times of writing counted or the latest time at which data is written to the logic array 107 can be used, for example. The amount of the configuration data or the like can also be used as the management information.

For example, the configuration data 105 whose number of times of writing to the logic array 107 is large is expected to have high frequency of use; thus, a period until the data is written to the logic array 107 again is expected to be short. Accordingly, in one embodiment of the present invention, owing to the memory module 109 having the above configuration, the memory element 108 preferentially stores the configuration data 105 that is expected to have high frequency of use. The configuration data 105 that is expected to have high frequency of use can be stored in the memory element 108 to reduce the time required to execute the application 104 with high frequency of use. Further, the amount of the configuration data 105 transferred from the storage device 103 to the memory element 108 using DMA transfer or through the processor 101 can be controlled. Thus, a delay in processing the processor 101 due to data transfer, which is a bottleneck, can be prevented even when the plurality of the applications 104 is executed.

Figure 3:
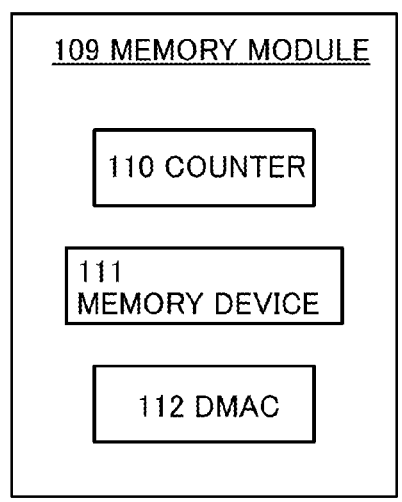
FIG. 3 illustrates a configuration of a memory module.

FIG. 3 is a block diagram illustrating a specific configuration example of the memory module 109 illustrated in FIG. 1. The memory module 109 illustrated in FIG. 3 includes a counter 110, a storage device 111, and a DMAC 112. The counter 110 has a function of counting the number of times each configuration data 105 is written to the logic array 107 using an identifier of the configuration data 105. The storage device 111 has a function of storing management information including the identifier of the configuration data 105 and the number of times of writing to the logic array 107 counted using each identifier. As described above, the latest time at which data is written to the logic array 107, the amount of the configuration data, or the like can also be stored in the storage device 111 as the management information. Note that to obtain the latest time at which data is written to the logic array 107 as the management information, time is measured in the processor 101 and data on the time is stored in the storage device 111 of the memory module 109.

Next, an operation example of the PLD 102 from a request for execution of a thread from the processor 101 to the PLD 102 until the termination of the execution of the thread will be described using a flow chart of FIG. 2.

Figure 2:
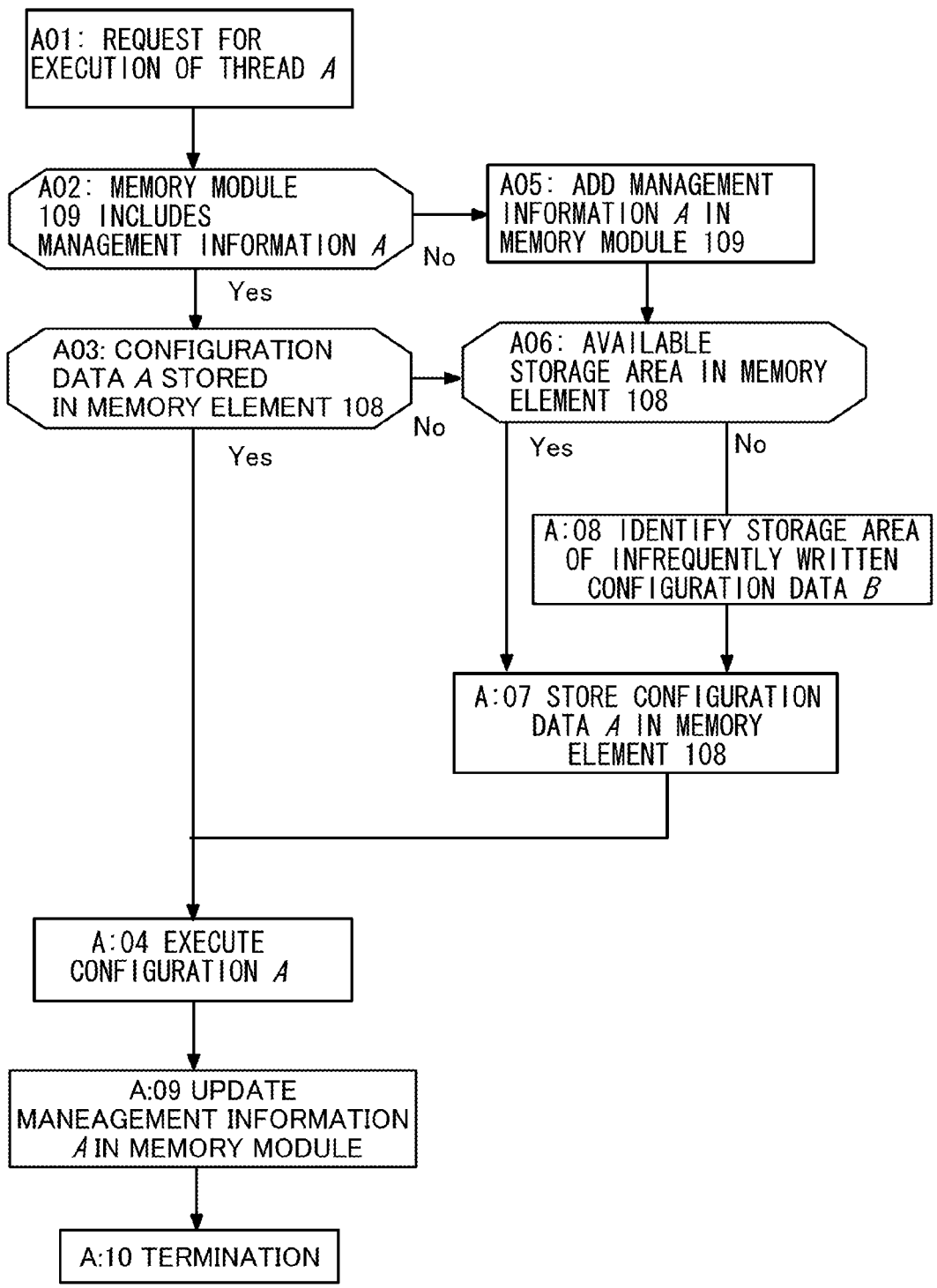
FIG. 2 is a flow chart of operation of a semiconductor device.

In the flow chart of FIG. 2, first, an instruction for requesting the PLD 102 to execute a thread A is sent from the processor 101 (A01: REQUEST FOR EXECUTION OF THREAD A). In the PLD 102, whether the memory module 109 has management information A including an identifier of configuration data A related to the thread A and data on a status of use of the configuration data A is determined (A02: MEMORY MODULE 109 INCLUDES MANAGEMENT INFORMATION A).

In the case where the memory module 109 has the management information A, it means that the configuration data A has been written to the memory element 108 at least once. In that case, whether the configuration data A is stored in the memory element 108 is determined in the PLD 102 (A03: CONFIGURATION DATA A STORED IN MEMORY ELEMENT 108).

In the case where the configuration data A is stored in the memory element 108, a logic circuit configured in the logic array 107 is defined in accordance with the configuration data A (A04: EXECUTE CONFIGURATION A).

On the other hand, in the case where the memory module 109 does not have the management information A, it means that the configuration data A has not been written to the memory element 108. In that case, the management information A is added to management information stored in the memory module 109 (A05: ADD MANAGEMENT INFORMATION A IN MEMORY MODULE 109). Then, after the management information A is added in the memory module 109, whether there is an available storage area to store the configuration data A in the memory element 108 is determined in the memory module 109 (A06: AVAILABLE STORAGE AREA IN MEMORY ELEMENT 108).

In the case where a storage area is available, the configuration data A is stored in the memory element 108 (A07: store configuration data A in memory element 108).

In the case where a storage area is unavailable, the memory module 109 selects configuration data B from configuration data stored in the memory element 108, using all stored management information. The configuration data B in which the number of times of writing to the logic array 107 is small, that is, configuration data whose frequency of writing is low is selected. Then, the storage area in the memory element 108 where the configuration data B whose frequency of writing is low is stored is identified (A08: IDENTIFY STORAGE AREA OF INFREQUENTLY WRITTEN CONFIGURATION DATA B).

Note that a designer can select as appropriate which management information to use and how to use the management information to select the configuration data B that is expected to have low frequency of use. For example, since configuration data whose number of times of writing to the logic array 107 is smaller and whose last writing to the logic array 107 is earlier is expected to have lower frequency of use, a period until the data is written to the logic array 107 again is expected to be long. Thus, configuration data whose frequency of writing to the logic array 107 is the lowest can be selected as the configuration data B. Alternatively, configuration data whose last writing to the logic array 107 is the earliest can be selected as the configuration data B. Further alternatively, configuration data whose number of times of writing to the logic array 107 is the M-th (M is a natural number greater than or equal to 2) largest or smaller and whose last writing to the logic array 107 is the earliest can be selected as the configuration data B.

Note that configuration data whose amount is small enables the amount of transferred data to be small even when the data needs to be transferred to the memory element 108 again. Thus, selecting configuration data whose amount of data is the smallest among configuration data whose number of times of writing to the logic array 107 is the M-th largest or smaller as the configuration data B enables the amount of transferred data to be small.

After the storage area where the configuration data B whose frequency of writing is low is stored is identified (A08: IDENTIFY STORAGE AREA OF INFREQUENTLY WRITTEN CONFIGURATION DATA B), the configuration data A is stored in the storage area of the memory element 108 (A07: STORE CONFIGURATION DATA A IN MEMORY ELEMENT 108). Then, a logic circuit configured in the logic array 107 is defined in accordance with the configuration data A (A04: EXECUTE CONFIGURATION A). After that, arithmetic processing is performed in the defined logic circuit, whereby the thread A is executed.

Note that after a logic circuit configured in the logic array 107 is defined (A04: EXECUTE CONFIGURATION A), the management information A is updated in the memory module 109 (A09: UPDATE MANAGEMENT INFORMATION A IN MEMORY MODULE 109). In the case where the management information A includes the number of times the data is written to the logic array 107, for example, the management information A is updated so that the number of times is increased by one. In contrast, in the case where the management information A includes the latest time at which the data is written to the logic array 107, the management information A is updated so that the latest time is updated.

After the management information A is updated (A09: UPDATE MANAGEMENT INFORMATION A IN MEMORY MODULE 109), the process in the PLD 102 is terminated (A10: TERMINATION).

In the flow chart of FIG. 2, the management information A is updated (A09: UPDATE MANAGEMENT INFORMATION A IN MEMORY MODULE 109) after a logic circuit configured in the logic array 107 is defined (A04: EXECUTE CONFIGURATION A); however, the management information A can be updated any time after the PLD 102 receives an instruction for requesting execution of the thread A (A01: REQUEST FOR EXECUTION OF THREAD A).

Next, schematic diagrams of data structures of the application 104 and the configuration data 105 stored in the storage device 103 illustrated in FIG. 1 are illustrated in FIGS. 4A to 4C. FIG. 4A illustrates an example of the storage device 103 in which two pieces of the configuration data 105 are related to one application 104. Note that the number of pieces of the configuration data 105 related to one application 104 may be three or more.

In the storage device 103 illustrated in FIG. 4B, the application 104 to which no configuration data 105 is related, the application 104 to which one configuration data 105 is related, and the application 104 to which two pieces of the configuration data 105 are related exist together.

FIG. 4C illustrates an example of the storage device 103 in which one configuration data 105 is related to two applications 104 so as to be shared. Note that the number of the applications 104 to which one configuration data 105 is related may be three or more.

Figure 5A:
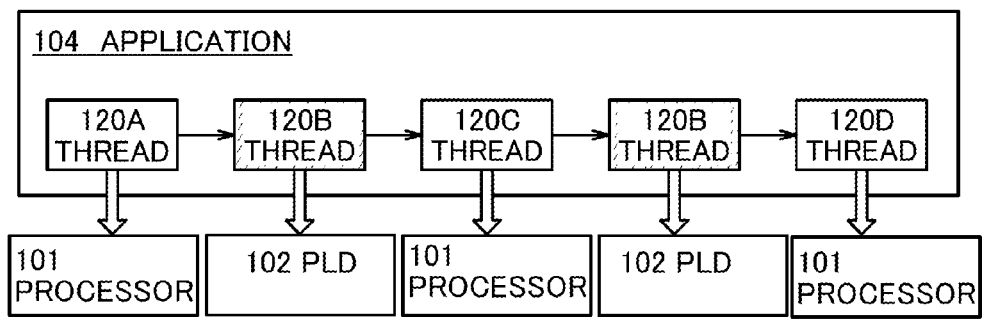
FIGS. 5A and 5B each schematically illustrate a relation between a plurality of threads and a processor or a PLD.
Figure 5B:
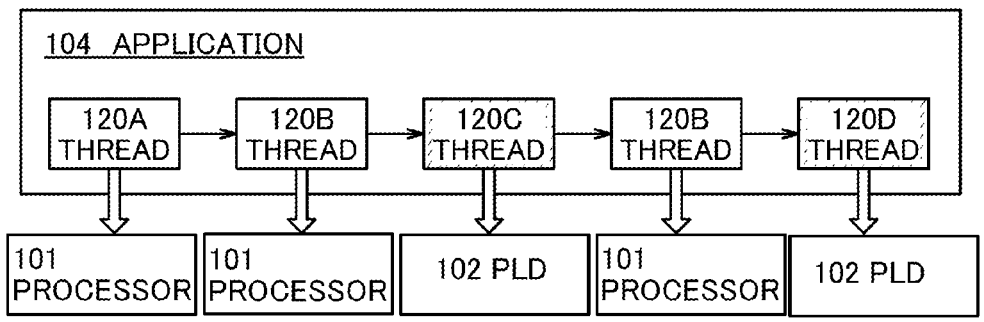

FIGS. 5A and 5B each schematically illustrate an example of a relation between a plurality of threads included in the application 104 and the processor 101 or the PLD 102 by which each thread is executed. FIGS. 5A and 5B each illustrate an example where the application 104 includes a thread 120A, a thread 120B, a thread 120C, and a thread 120D. Each example in FIGS. 5A and 5B illustrate the case where the thread 120A, the thread 120B, the thread 120C, the thread 120B, and the thread 120D are executed in that order, so that the application 104 is executed.

FIG. 5A illustrates the case where the thread 120A, the thread 120C, and the thread 120D are executed by software in the processor 101 and the thread 120B is executed by hardware in the PLD 102. In the case where the application 104 illustrated in FIG. 5A is executed, the configuration data 105 which is necessary for the PLD 102 to execute the thread 120B is related to the application 104 and stored in the storage device 103 illustrated in FIG. 1.

FIG. 5B illustrates the case where the thread 120A and the thread 120B are executed by software in the processor 101 and the thread 120C and the thread 120D are executed by hardware in the PLD 102. In the case where the application 104 illustrated in FIG. 5B is executed, the configuration data 105 which is necessary for the PLD 102 to execute the thread 120C and the configuration data 105 which is necessary for the PLD 102 to execute the thread 120D are related to the application 104 and stored in the storage device 103 illustrated in FIG. 1.

Figure 6A:
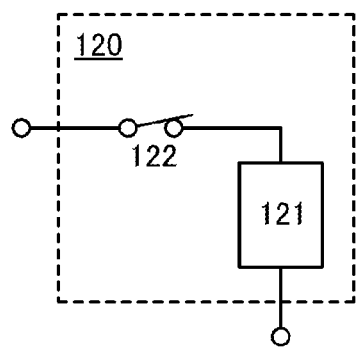
FIGS. 6A and 6B illustrate a configuration of a memory cell and a structure of a transistor.

Next, a configuration example of a memory cell included in the memory element 108 is described with reference to FIGS. 6A and 6B. FIG. 6A is an example of a circuit diagram of a memory cell 120. The memory element 108 includes a plurality of the memory cells 120 and each memory cell 120 includes a storage element 121 and a switch 122.

As the storage element 121, a semiconductor element such as a capacitor or a transistor can be used. In the storage element 121, charge is accumulated in a capacitor or a gate capacitance formed between a gate electrode and an active layer of a transistor, whereby data is stored. The switch 122 controls supply of charge to the storage element 121, discharge of the charge from the storage element 121, and retention of the charge in the storage element 121.

A transistor includes, in a channel formation region, a semiconductor whose band gap is wider than that of silicon and whose intrinsic carrier density is lower than that of silicon is used as the switch 122. As such a semiconductor, for example, an oxide semiconductor, silicon carbide, gallium nitride, gallium oxide, and the like each have a band gap greater than or equal to twice the band gap of silicon can be given. A transistor including the semiconductor can have a much lower off-state current than a transistor including a normal semiconductor such as silicon or germanium. Thus, the use of the transistor having the above structure as the switch 122 for retaining charge which flows into the storage element 121 makes it possible to prevent leakage of current from the storage element 121 and thus to ensure a long data retention time.

Note that the memory cell 120 may further include another circuit element such as a transistor, a diode, a resistor, or an inductor as needed.

Unless otherwise specified, in this specification, the off-state current of an n-channel transistor is a current that flows between a source terminal and a drain terminal when the potential of a gate electrode is lower than or equal to 0 with the potential of the source terminal as a reference potential while the potential of the drain terminal is higher than those of the source terminal and the gate electrode. Moreover, in this specification, the off-state current of a p-channel transistor is a current that flows between a source terminal and a drain terminal when the potential of a gate electrode is higher than or equal to 0 with the potential of the source terminal as a reference potential while the potential of the drain terminal is lower than those of the source terminal and the gate electrode.

Note that the switch 122 may include one transistor or a plurality of transistors. With a plurality of transistors connected in series, for example, the off-state current of the switch 122 can be lower; thus, leakage of charge from the storage element 121 can be further reduced.

In this specification, a state in which transistors are connected to each other in series means a state in which only one of a source terminal and a drain terminal of a first transistor is connected to only one of a source terminal and a drain terminal of a second transistor. In addition, a state in which transistors are connected to each other in parallel means a state in which one of a source terminal and a drain terminal of a first transistor is connected to one of a source terminal and a drain terminal of a second transistor and the other of the source terminal and the drain terminal of the first transistor is connected to the other of the source terminal and the drain terminal of the second transistor.

Figure 6B:
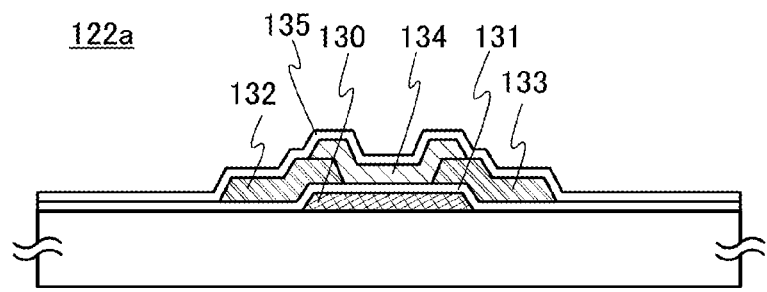

FIG. 6B illustrates a cross-sectional structure of a transistor 122a which is used as the switch 122 as an example. Note that FIG. 6B illustrates an example of the transistor 122a in which an oxide semiconductor is used for an active layer.

The transistor 122a includes, a gate electrode 130 over an insulating surface, a gate insulating film 131 over the gate electrode 130, a conductive film 132 and a conductive film 133 over the gate insulating film 131, and an oxide semiconductor film 134 which overlaps with the gate electrode 130 over the gate insulating film 131 and functions as an active layer over the conductive film 132 and the conductive film 133. The transistor 122a may further include an insulating film 135 over the conductive film 132, the conductive film 133, and the oxide semiconductor film 134.

Note that a highly purified oxide semiconductor (purified OS) obtained by reduction of impurities such as moisture or hydrogen serving as an electron donor (donor) and by reduction of oxygen defects is an i-type (intrinsic) semiconductor or a substantially i-type semiconductor. Accordingly, with the use of an oxide semiconductor film that is highly purified by sufficiently reducing the concentration of impurities such as moisture or hydrogen and by reducing oxygen defects, the off-state current of the transistor can be reduced. Thus, with the use of a transistor including a highly purified oxide semiconductor film as the switch 122, an effect of preventing the leakage of charge from the storage element 121 to secure a long data retention period can be enhanced.

A variety of experiments can prove a low off-state current of a transistor including a highly purified oxide semiconductor for a channel formation region. For example, the off-state current of even an element having a channel width of $1\times10^6$ μm and a channel length of 10 μm can be less than or equal to the measurement limit of a semiconductor parameter analyzer, that is, less than or equal to $1\times10^{-13}$ A at a voltage between the source electrode and the drain electrode (a drain voltage) of 1 V to 10 V. In this case, it can be seen that the off-state current standardized on the channel width of the transistor is lower than or equal to 100 zA/μm. In addition, the off-state current is measured using a circuit in which a capacitor and a transistor are connected to each other and charge flowing into or from the capacitor is controlled by the transistor. In the measurement, a highly purified oxide semiconductor film is used for a channel formation region of the transistor, and the off-state current of the transistor is measured from a change in the amount of electrical charge of the capacitor per unit time. As a result, it is found that when the voltage between the source electrode and the drain electrode of the transistor is 3 V, a lower off-state current of several tens of yoctoamperes per micrometer (yA/μm) is obtained. Consequently, the transistor in which a highly purified oxide semiconductor film is used for a channel formation region has much lower off-state current than a transistor including crystalline silicon.

An oxide semiconductor such as an In—Ga—Zn-based oxide or an In—Sn—Zn-based oxide has an advantage of high mass productivity because a transistor with excellent electrical characteristics can be formed by depositing the oxide semiconductor by a sputtering method or a wet process, unlike silicon carbide, gallium nitride, or gallium oxide. Further, unlike silicon carbide, gallium nitride, or gallium oxide, the In—Ga—Zn-based oxide which is an oxide semiconductor can be deposited even at room temperature; thus, the oxide semiconductor can be deposited over a glass substrate or a transistor with excellent electrical characteristics can be formed over an integrated circuit using silicon. Furthermore, the oxide semiconductor can respond to an increase in substrate size.

Note that an oxide semiconductor preferably contains at least indium (In) or zinc (Zn). Further, a stabilizer for reducing variation in electric characteristics of a transistor including the oxide semiconductor, gallium (Ga) is preferably additionally included. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, the oxide semiconductor may contain one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor, any of the following oxides can be used, for example: indium oxide, gallium oxide, tin oxide, zinc oxide; two-component metal oxides such as In—Zn-based oxide, Sn—Zn-based oxide, Al—Zn-based oxide, Zn—Mg-based oxide, Sn—Mg-based oxide, In—Mg-based oxide, and In—Ga-based oxide; three-component metal oxides such as In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, and In—Lu—Zn-based oxide; and four-component metal oxides such as In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, an In—Ga—Zn-based oxide refers to an oxide containing In, Ga, and Zn, and there is no limitation on the composition ratio of In, Ga, and Zn. Further, the In—Ga—Zn-based oxide may contain a metal element other than In, Ga, and Zn. The In—Ga—Zn-based oxide has sufficiently high resistance when no electric field is applied thereto, so that the off-state current can be sufficiently reduced. Moreover, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8) or an oxide with an atomic ratio close to the above atomic ratios may be used.

For example, high mobility can be obtained relatively easily in the case of using an In—Sn—Zn-based oxide. However, mobility can be increased by reducing the defect density in a bulk also in the case of using an In—Ga—Zn-based oxide.

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

In a transistor using the CAAC-OS film, change in electric characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

For example, the CAAC-OS film is formed by sputtering with a polycrystalline metal oxide target. By collision of ions with the target, a crystal region included in the target may be separated from the target along an a-b plane; in other words, sputtered particles having a plane parallel to the a-b plane (flat-plate-like sputtered particles or pellet-like sputtered particles) may flake off from the target. In this case, the flat-plate-like sputtered particles reach a substrate while maintaining their crystal state, whereby the CAAC-OS film can be formed.

For the deposition of the CAAC-OS film, the following conditions are preferably used.

The crystal state can be prevented from being broken by the impurities by reducing the amount of impurities entering the CAAC-OS film during the deposition, for example, by reducing the concentration of impurities (e.g., hydrogen, water, carbon dioxide, and nitrogen) that exist in the deposition chamber or by reducing the concentration of impurities in a deposition gas. Specifically, a deposition gas with a dew point of −80° C. or lower, preferably −100° C. or lower is used.

By increasing the substrate heating temperature during the deposition, migration of sputtered particles is likely to occur after the sputtered particles reach a substrate surface. Specifically, the substrate heating temperature during the deposition ranges from 100° C. to 740° C., preferably from 200° C. to 500° C. By increasing the substrate heating temperature during the deposition, when the flat-plate-like sputtered particles reach the substrate, migration occurs on the substrate surface, so that a flat plane of the flat-plate-like sputtered particles is attached to the substrate.

It is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the target, an In—Ga—Zn-based oxide target will be described below.

A polycrystalline In—Ga—Zn-based oxide target is made by mixing $InO_X$ powder, $GaO_Y$ powder, and $ZnO_Z$ powder at a predetermined molar ratio, applying pressure to the mixture, and then performing heat treatment on the mixture at temperatures ranging from 1000° C. to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired target.

FIG. 6B illustrates an example where the transistor 122a has a single-gate structure in which one channel formation region corresponding to one gate electrode 130 is provided. However, the transistor 122a may have a multi-gate structure in which a plurality of electrically connected gate electrodes is provided so that a plurality of channel formation regions is included in one active layer.

The transistor 122a includes a gate electrode at least on one side of an active layer. Alternatively, the transistor may include a pair of gate electrodes with the active layer provided therebetween. When the transistor includes a pair of gate electrodes with the active layer positioned therebetween, a signal for controlling switching may be supplied to one of the gate electrodes, and the other of the gate electrodes may be electrically isolated (floating) or may be supplied with a potential from another element. In the latter case, potentials at the same level may be supplied to the pair of electrodes, or a fixed potential such as a ground potential may be supplied only to the other of the gate electrodes. By controlling the level of a potential applied to the other of the gate electrodes, the threshold voltage of the transistor 122a can be controlled.

Note that in this specification, the term "connection" means electrical connection and corresponds to a state in which current, voltage, or a potential can be supplied or transmitted. Thus, a state of being "connected" means not only a state of direct connection but also a state of indirect connection through an element such as a resistor, a diode, a transistor, or a capacitor, in which current, voltage, or a potential can be supplied or transmitted.

Although FIG. 6B illustrates a MOSFET as an example of the transistor 122a, a transistor that can be used as the switch 122 may be a metal semiconductor field effect transistor (MESFET).

With the memory element 108 including a plurality of memory cells having the above configuration, the semiconductor device 100 of one embodiment of the present invention does not consume power in the memory element 108 included in the PLD 102 because of an off-state current of a transistor as in an SRAM. Further, the memory element 108 having the above configuration can reduce the frequency of refresh operation, so that power consumed by refresh operation can be significantly reduced as compared with a DRAM. In addition, the time required to write data can be short as compared with an EEPROM, so that the time required for configuration of the PLD 102 can be reduced and the application 104 can be executed at high speed.

Next, a specific configuration example of the memory cell will be described with reference to FIGS. 7A to 7C. Note that in specification, a source terminal of a transistor means a source region that is part of a semiconductor film functioning as an active layer or a source electrode that is connected to the semiconductor film functioning as an active layer. Similarly, a drain terminal of a transistor means a drain region that is part of a semiconductor film functioning as an active layer or a drain electrode that is connected to the semiconductor film functioning as an active layer.

The terms "source terminal" and "drain terminal" of a transistor interchange with each other depending on the type of the channel of the transistor or levels of potentials applied to the source terminal and the drain terminal. In general, in an n-channel transistor, one to which a lower potential is applied is called a source terminal, and one to which a higher potential is applied is called a drain terminal. In a p-channel transistor, one to which a lower potential is applied is called a drain terminal, and one to which a higher potential is applied is called a source terminal. In this specification, although the connection relation of the transistor is sometimes described assuming that the source terminal and the drain terminal are fixed for convenience, actually, the names of the source terminal and the drain terminal may interchange with each other depending on the relation of the potentials.

Figure 7A:
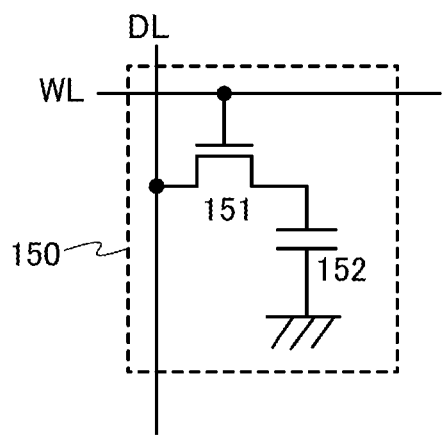
FIGS. 7A to 7C are each a circuit diagram of a memory cell.

A memory cell 150 illustrated in FIG. 7A includes a transistor 151 functioning as the switch 122 and a capacitor 152 functioning as the storage element 121. A gate electrode of the transistor 151 is connected to a word line WL. Further, one of a source terminal and a drain terminal of the transistor 151 is connected to a data line DL and the other of the source terminal and the drain terminal of the transistor 151 is connected to one electrode of the capacitor 152. The other electrode of the capacitor 152 is connected to a node to which fixed potential such as a ground potential is supplied.

In the memory cell 150 illustrated in FIG. 7A, the transistor 151 is turned on at the time of data writing, so that a potential of a signal including data is supplied from the data line DL to the one electrode of the capacitor 152 through the transistor 151. The amount of charge accumulated in the capacitor 152 is controlled in accordance with the potential of the signal, so that data is written to the capacitor 152.

Then, the transistor 151 is turned off when data is retained, so that the charge is retained in the capacitor 152. As described above, the transistor 151 has a characteristic of an extremely low off-state current. Thus, the charge accumulated in the capacitor 152 is less likely to leak, and thus, the data can be retained for a long period of time as compared with the case where a semiconductor material such as silicon is used for the transistor 151.

At the time of data reading, the transistor 151 is turned on, so that the charge accumulated in the capacitor 152 is taken out through the data line DL. The difference in the amount of charge is read, whereby data can be read.

Figure 7B:
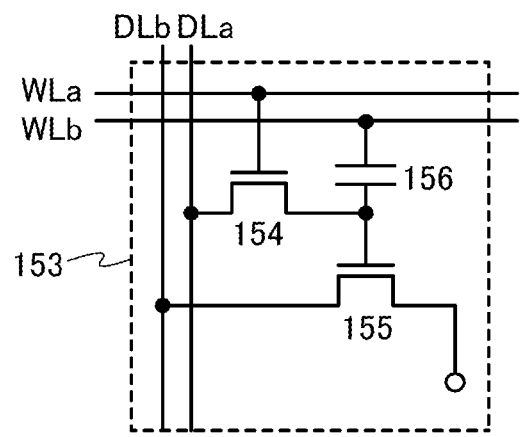

A memory cell 153 illustrated in FIG. 7B includes a transistor 154 functioning as the switch 122, and a transistor 155 and a capacitor 156 collectively functioning as the storage element 121. A gate electrode of the transistor 154 is connected to a first word line WLa. In the transistor 154, one of a source terminal and a drain terminal is connected to a first data line DLa and the other of the source terminal and the drain terminal is connected to a gate electrode of the transistor 155. Further, one of a source terminal and a drain terminal of the transistor 155 is connected to a second data line DLb, and the other of the source terminal and the drain terminal of the transistor 155 is connected to a node to which a predetermined potential is applied. The capacitor 156 includes a pair of electrodes, one of which is connected to the gate electrode of the transistor 155, and the other of which is connected to a second word line WLb.

In the memory cell 153 illustrated in FIG. 7B, the transistor 154 is turned on at the time of data writing, so that a potential of a signal including data is supplied from the first data line DLa to the gate electrode of the transistor 155 through the transistor 154. A gate capacitance of the transistor 155 and the amount of charge accumulated in the capacitor 156 are controlled in accordance with the potential of the signal, so that data is written to the transistor 155 and the capacitor 156.

When data is retained, the transistor 154 is turned off, so that the charge accumulated in the gate capacitance of the transistor 155 and the capacitor 156 is retained. As described above, the transistor 154 has a characteristic of an extremely low off-state current. Thus, the accumulated charge is less likely to leak, and thus, the data can be retained for a long period of time as compared with the case where a semiconductor material such as silicon is used for the transistor 154.

At the time of data reading, a potential of the second word line WLb is changed. A potential difference between the pair of electrodes included in the capacitor 156 is kept in accordance with the principle of charge conservation, and thus, the change in the potential of the second word line WLb is supplied to the gate electrode of the transistor 155. A threshold voltage of the transistor 155 is changed depending on the amount of charge accumulated in the gate capacitance of the transistor 155. Thus, a difference in the amount of accumulated charge is read from the amount of a drain current of the transistor 155 which is obtained through the change in the potential of the gate electrode of the transistor 155, so that data can be read.

Note that an oxide semiconductor film may be used for an active layer of the transistor 155 functioning as the storage element 121. Alternatively, for the active layer of the transistor 155, instead of an oxide semiconductor, any of the following semiconductors may be used: amorphous silicon, microcrystalline silicon, polycrystalline silicon, single crystal silicon, amorphous germanium, microcrystalline germanium, polycrystalline germanium, single crystal germanium, or the like. The use of an oxide semiconductor film for active layers of all the transistors in the memory cell 153 makes it possible to simplify a manufacturing process. Further, for example, the active layer of the transistor 155 functioning as the storage element 121 is formed using a semiconductor material such as polycrystalline silicon or single crystal silicon which provides higher mobility than an oxide semiconductor, whereby data can be read from the memory cell 153 at high speed.

Figure 7C:
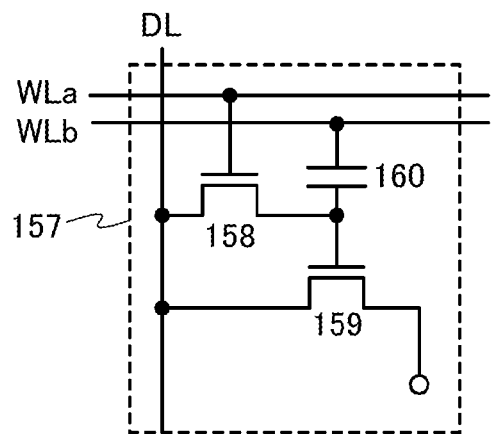

A memory cell 157 illustrated in FIG. 7C is different from the memory cell 153 illustrated in FIG. 7B in that one data line DL has functions of the first data line DLa and the second data line DLb. Specifically, the memory cell 157 illustrated in FIG. 7C includes a transistor 158 functioning as the switch 122, and a transistor 159 and a capacitor 160 collectively functioning as the storage element 121. A gate electrode of the transistor 158 is connected to a first word line WLa. Further, one of a source terminal and a drain terminal of the transistor 158 is connected to a data line DL and the other of the source terminal and the drain terminal of the transistor 158 is connected to a gate electrode of the transistor 159. One of a source terminal and a drain terminal of the transistor 159 is connected to the data line DL, and the other of the source terminal and the drain terminal of the transistor 159 is connected to a node to which a predetermined potential is applied. The capacitor 160 includes a pair of electrodes, one of which is connected to the gate electrode of the transistor 159 and the other of which is connected to a second word line WLb.

Operation such as writing, retention, and reading of data can be performed in the memory cell 157 illustrated in FIG. 7C in a manner similar to that in the memory cell 157 illustrated in FIG. 7B.

Figure 8:
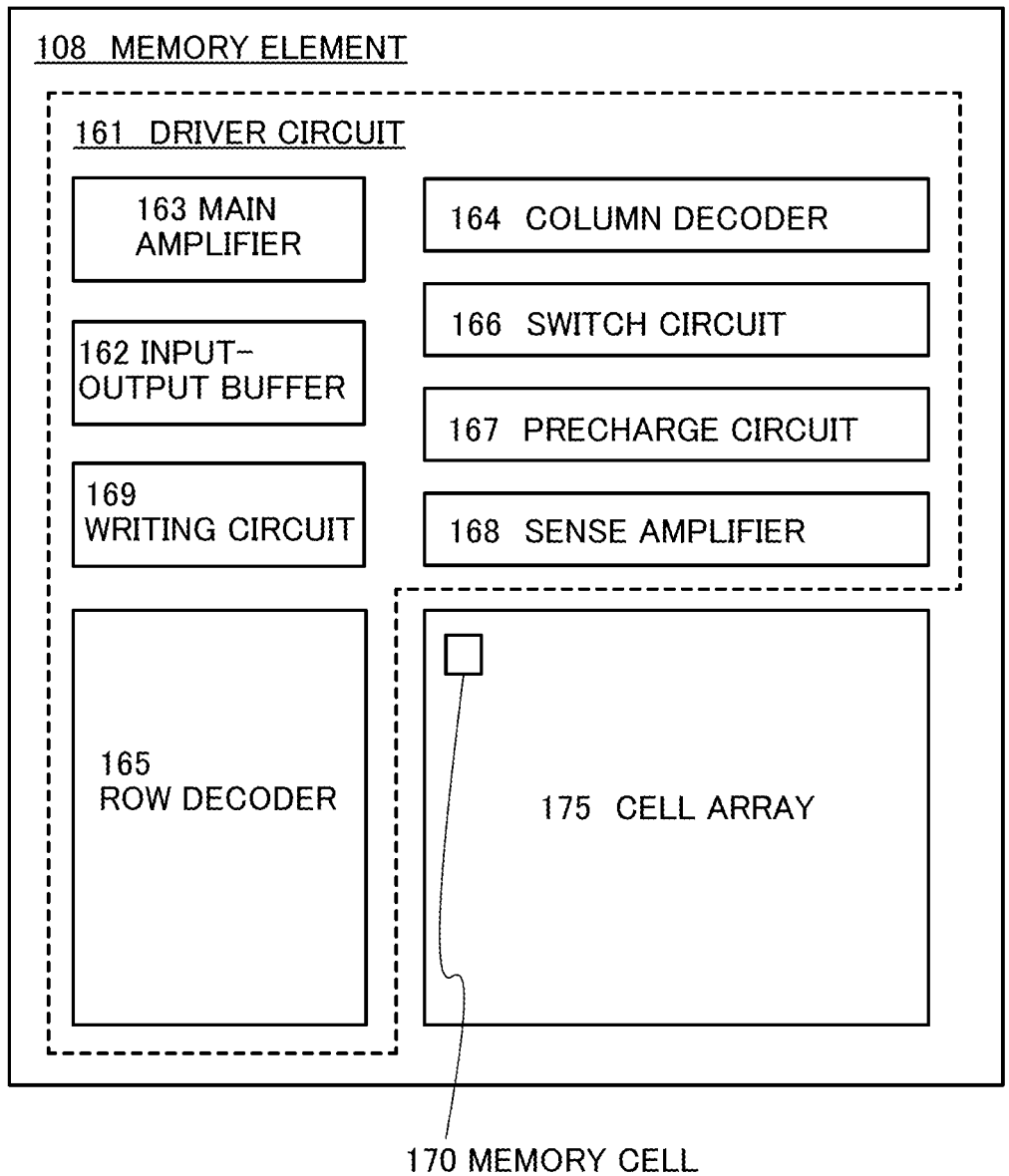
FIG. 8 is a block diagram illustrating a configuration of a memory element.

Next, a configuration example of the memory element 108 illustrated in FIG. 1 will be described. FIG. 8 is a block diagram illustrating a configuration example of the memory element 108.

The memory element 108 illustrated in FIG. 8 includes a cell array 175 including a plurality of memory cells 170 and a driver circuit 161. The driver circuit 161 includes an input-output buffer 162, a main amplifier 163, a column decoder 164, a row decoder 165, a switch circuit 166, a precharge circuit 167, a sense amplifier 168, and a writing circuit 169.

The input-output buffer 162 has a function of controlling input of a variety of signals to be used for driving the driver circuit 161 or the cell array 175 and configuration data to be written to the cell array 175 to the memory element 108. In the case where configuration data is read from the cell array 175, the input-output buffer 162 also has a function of controlling an output of the configuration data read from the cell array 175 from the memory element 108.

In the case where the memory cell 170 has the same configuration as the memory cell 150 illustrated in FIG. 7A, for example, the row decoder 165 has a function of controlling a potential applied to the word line WL to select the memory cell 170 in the cell array 175 per row in accordance with a specified address. The column decoder 164 has a function of controlling the operation of the switch circuit 166 to select the memory cells 170 in a column direction at the time of writing or reading of configuration data in accordance with a specified address.

In the case where the memory cell 170 has the same configuration as the memory cell 150 illustrated in FIG. 7A, for example, the switch circuit 166 has a function of connecting the data line DL and the main amplifier 163 and connecting the data line DL and the writing circuit 169. The writing circuit 169 has a function of writing configuration data to the memory cell 170 of a specified address through the switch circuit 166.

The sense amplifier 168 has a function of amplifying a change in the potential of the data line DL at the time of reading out configuration data from the memory cell 170. The sense amplifier 168 also has a function of temporarily storing configuration data that is written to the memory cell 170 or configuration data that is read out from the memory cell 170.

The main amplifier 163 has a function of reading out configuration data using the potential of the data line DL which is amplified by the sense amplifier 168. The precharge circuit 167 has a function of resetting the potential of the data line DL before reading out configuration data.

Note that the memory element 108 may include an address buffer which can temporarily store the address of the specified memory cell 170.

Figure 9:
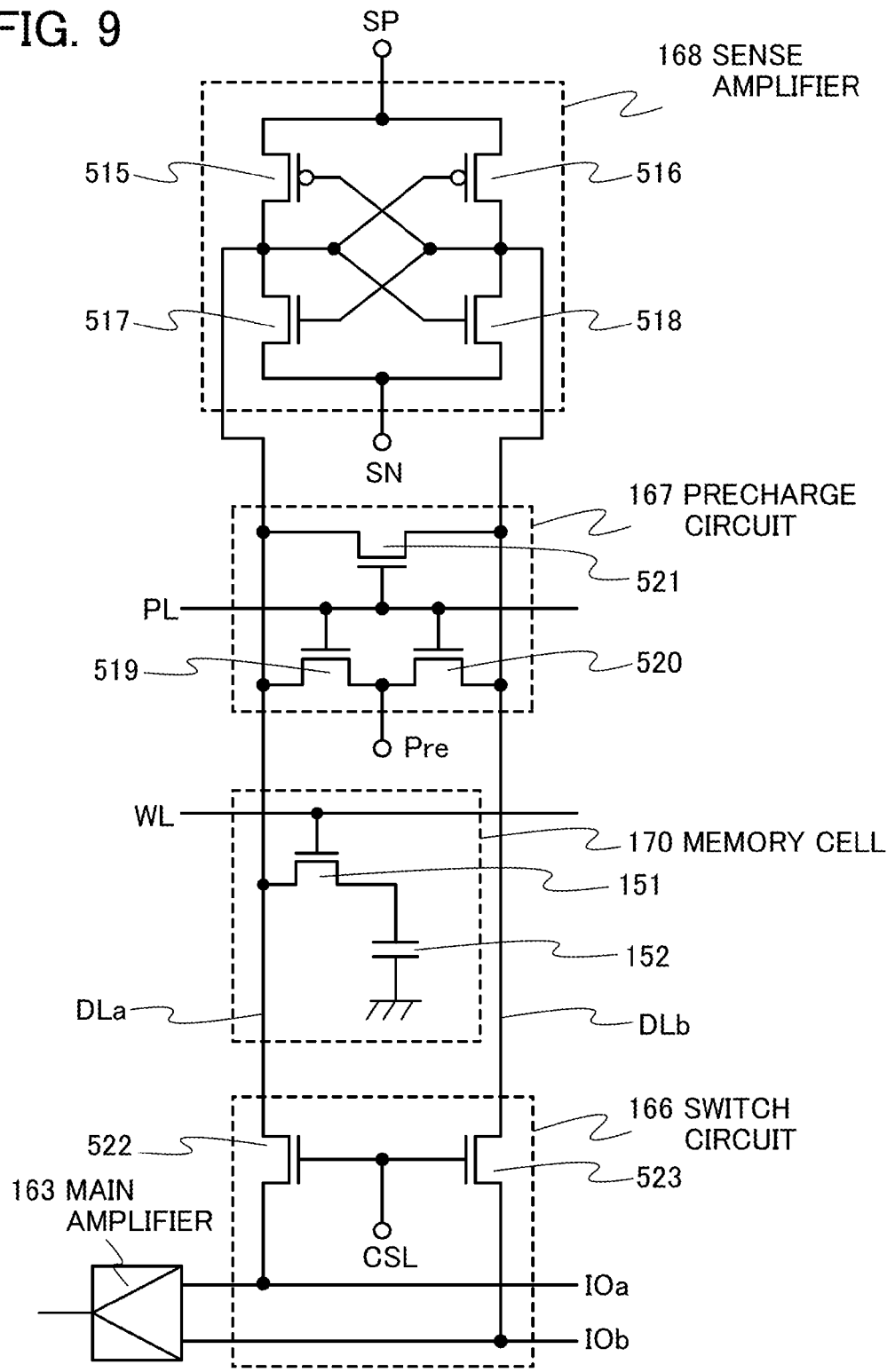
FIG. 9 illustrates a connection structure of a memory cell, a sense amplifier, a precharge circuit, a switch circuit, and a main amplifier.

Next, an example of a connection structure between the sense amplifier 168, the precharge circuit 167, the switch circuit 166, and the main amplifier 163 which are assigned to the memory cells 170 of one column is illustrated in FIG. 9. FIG. 9 illustrates an example where the memory cell 170 has the same configuration as the memory cell 150 illustrated in FIG. 7A.

The memory cell 170 includes the transistor 151 and the capacitor 152. Further, the memory cell 170 is connected to the data line DLa. The sense amplifier 168, the precharge circuit 167, and the switch circuit 166 are connected to the data line DLa and the data line DLb. The data line DLa and the data line DLb each corresponding to one of a plurality of data lines DL connected to respective memory cells 170. Note that all the memory cells 170 to which the data line DLa or the data line DLb is connected are connected to different word lines WL.

Specifically, FIG. 9 illustrates the case where the sense amplifier 168 is a latch sense amplifier. The sense amplifier 168 includes p-channel transistors 515 and 516 and n-channel transistors 517 and 518. One of a source terminal and a drain terminal of the transistor 515 is connected to a terminal SP and the other is connected to gate electrodes of the transistors 516 and 518 and the data line DLa. One of a source terminal and a drain terminal of the transistor 517 is connected to the gate electrodes of the transistors 516 and 518 and the data line DLa and the other is connected to a terminal SN. One of a source terminal and a drain terminal of the transistor 516 is connected to the terminal SP and the other is connected to gate electrodes of the transistors 515 and 517 and the data line DLb. One of a source terminal and a drain terminal of the transistor 518 is connected to the gate electrodes of the transistors 515 and 517 and the data line DLb and the other is connected to the terminal SN.

The precharge circuit 167 includes n-channel transistors 519 to 521. The transistors 519 to 521 may be p-channel transistors. One of a source terminal and a drain terminal of the transistor 519 is connected to the data line DLa and the other is connected to a terminal Pre. One of a source terminal and a drain terminal of the transistor 520 is connected to the data line DLb and the other is connected to the terminal Pre. One of a source terminal and a drain terminal of the transistor 521 is connected to the data line DLa and the other is connected to the data line DLb. Gate electrodes of the transistors 519 to 521 are connected to a wiring PL.

The switch circuit 166 includes n-channel transistors 522 and 523. The transistors 522 and 523 may be p-channel transistors. One of a source terminal and a drain terminal of the transistor 522 is connected to the data line DLa and the other is connected to a wiring IOa. One of a source terminal and a drain terminal of the transistor 523 is connected to the data line DLb and the other is connected to a wiring IOb. Gate electrodes of the transistors 522 and 523 are connected to a terminal CSL. The potential of the terminal CSL is controlled by the column decoder 164.

The wirings IOa and IOb are connected to the main amplifier 163. The writing circuit 169 has a function of supplying potential to the wirings IOa and IOb in accordance with configuration data.

The sense amplifier 168 is not limited to the above latch sense amplifier, and may be a current-mirror sense amplifier or a single-end sense amplifier. In the case where the sense amplifier 168 is a single-end sense amplifier, the potential of the data line DLb need not be reset; thus, the transistors 520 and 521 in the precharge circuit 167 can be omitted.

The combination of the data line DLa and the data line DLb can be determined as appropriate in accordance with an array structure. In one embodiment of the present invention, an array structure such as a folded bit line structure, a cross-point structure, or an open bit line structure can be used, and two of the plurality of the data lines DL connected to the plurality of the memory cells 170 are connected to the main amplifier 163 and the switch circuit 166 in accordance with the array structure. Note that as described above, all the memory cells 170 connected to the data line DLa or the data line DLb are connected to different word lines WL.

In the case where configuration data is written to the memory cell 170 from the writing circuit 169, first, the high-level potential VH_SP is supplied to the terminal SP and the low-level potential VL_SP is supplied to the terminal SN, so that the sense amplifier 168 is turned on. Then, the potentials of the wirings IOa and IOb are set to levels corresponding to the configuration data under the control of the writing circuit 169, and the transistors 522 and 523 in the switch circuit 166 are turned on. In this manner, the potential of the wiring IOa is supplied to the data line DLa, and the potential of the wiring IOb is supplied to the data line DLb. Then, the word line WL is selected and the transistor 151 is turned on, so that the capacitor 152 is connected to the data line DLa. Charge is accumulated in the capacitor 152 in accordance with the potential of the data line DLa, whereby the configuration data is written to the memory cell 170.

Note that after the potential of the wiring IOa is supplied to the data line DLa and the potential of the wiring IOb is supplied to the data line DLb, the relation in level between the potential of the data line DLa and the potential of the data line DLb is kept by the sense amplifier 168 as long as the sense amplifier 168 is in an on state even after the transistors 522 and 523 in the switch circuit 166 are turned off. Thus, the timing of switching the transistors 522 and 523 from an on state to an off state in the switch circuit 166 may be either before or after the selection of the word line WL.

Figure 10:
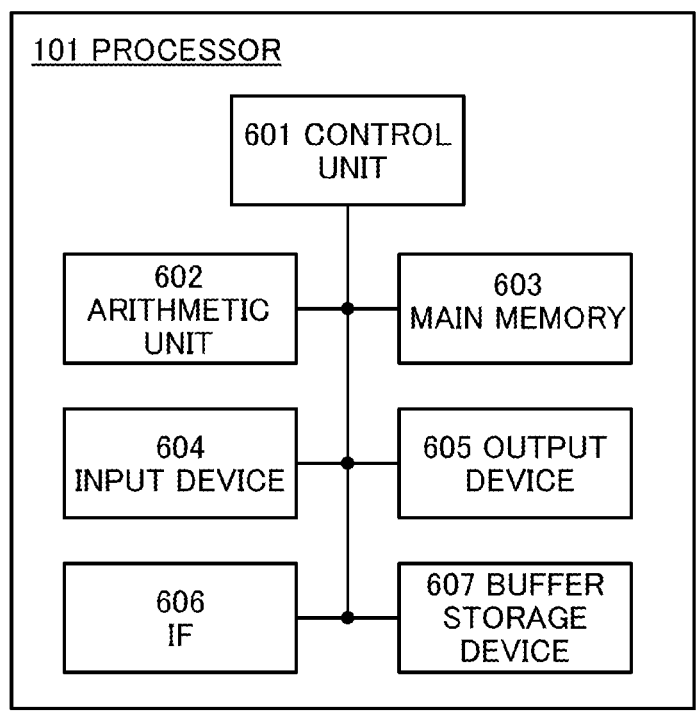
FIG. 10 illustrates a configuration of a processor.

Next, a specific configuration example of the processor 101 illustrated in FIG. 1 will be described. FIG. 10 is a block diagram illustrating a configuration example of the processor 101.

The processor 101 illustrated in FIG. 10 includes a control unit 601, an arithmetic unit 602, a main memory 603, an input device 604, an output device 605, an interface (IF) 606, and a buffer storage device 607.

The control unit 601 has a function of collectively controlling operations of the arithmetic unit 602, the main memory 603, the input device 604, the output device 605, the IF 606, and the buffer storage device 607 included in the processor 101 to decode and execute an input instruction included in a program such as an application. The arithmetic unit 602 has a function of performing a variety of arithmetic processing such as four arithmetic operations and logic operations.

Although FIG. 10 illustrates the control unit 601 and the arithmetic unit 602 as independent blocks, the processor 101 may include a central processing unit having both the function of the control unit 601 and the function of the arithmetic unit 602, instead of the control unit 601 and the arithmetic unit 602.

The main memory 603 has a function of storing a program such as an application including a plurality of instructions, which is executed by the control unit 601, and data used for arithmetic processing performed by the arithmetic unit 602.

The buffer storage device 607 has a function of storing data obtained during arithmetic processing performed by the arithmetic unit 602, data obtained as a result of performing arithmetic processing by the arithmetic unit 602, and the like. The buffer storage device 607 may have a function of temporarily storing a program such as an application.

The input device 604 has a function of sending an instruction input from the outside of the semiconductor device to the processor 101. As the input device 604, for example, a keyboard, a mouse, a touch panel, or the like can be used.

The output device 605 has a function of outputting an operation state of the processor 101, a result obtained by execution of a program such as an application, or the like as information. As the output device 605, for example, a display, a projector, a printer, a plotter, an audio output device, or the like can be used.

The IF 606 corresponds to a path for data between the processor 101 and the storage device 103 or the PLD 102 illustrated in FIG. 1. The application 104 and the configuration data 105 stored in the storage device 103 are input to the processor 101 through the IF 606. Data obtained by execution of a thread in the PLD 102 is input from the PLD 102 to the processor 101 through the IF 606. A variety of instructions and data output from the processor 101 are sent to the storage device 103 or the PLD 102 through the IF 606.

Note that the processor 101 may further include a DMAC in addition to the DMAC included in the PLD 102.

Execution of an instruction is repeated in the control unit 601, whereby a program is executed.

Next, a specific configuration example of the LE 106 illustrated in FIG. 1 will be described.

Figure 11A:
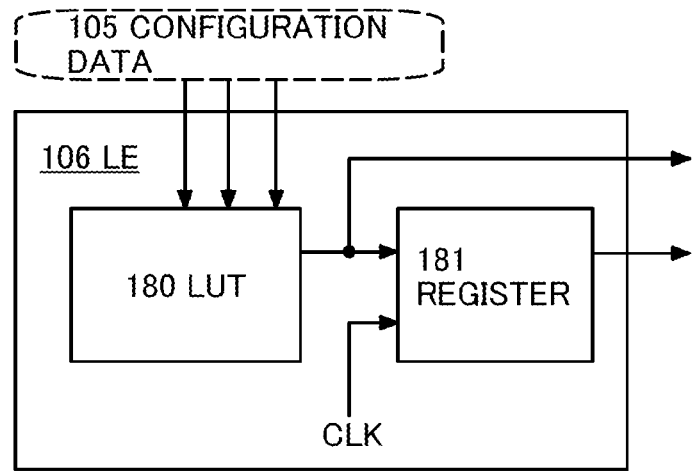
FIGS. 11A and 11B each illustrate a configuration of a logic element.

FIG. 11A illustrates one mode of the LE 106. The LE 106 illustrated in FIG. 11A includes a look-up table (LUT) 180 and a register 181. Logic operation executed by the LUT 180 varies depending on the configuration data 105. Determination of the configuration data 105 results in determination of one output value corresponding to plural input values of the LUT 180. An output signal including the output value is output from the LUT 180. The register 181 retains the output signal from the LUT 180 and outputs a signal corresponding the output signal in synchronization with a clock signal CLK.

Note that the LE 106 may include a multiplexer circuit with which selection can be made whether the output signal from the LUT 180 goes through the register 181 or not.

Further, the type of the register 181 may be determined by the configuration data 105. Specifically, the register 181 may have a function of any of a D register, a T register, a JK register, and an RS register depending on the configuration data 105.

Figure 11B:
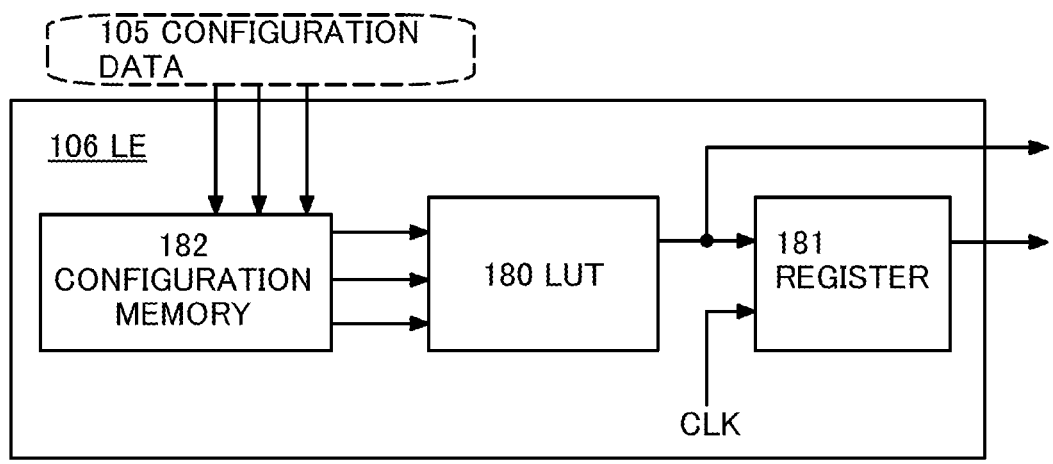

The LE 106 may also include a storage device (configuration memory) so that the configuration data 105 transmitted from the memory element 108 illustrated in FIG. 1 is stored in the LE 106. The LE 106 in FIG. 11B has a structure in which a configuration memory 182 is added to the LE 106 in FIG. 11A. With the configuration memory 182, the operation of determining again the logic operation executed in the LE 106 in accordance with the same configuration data 105 can be performed at high speed as compared with the case where the configuration data 105 that is transmitted directly from the memory element 108 is used.

Then, a configuration example of the LUT 180 included in the LE 106 is described. The LUT 180 can be composed of a plurality of multiplexers. The configuration data 105 can be input to any of input terminals and control terminals of the plurality of multiplexers.

Figure 12A:
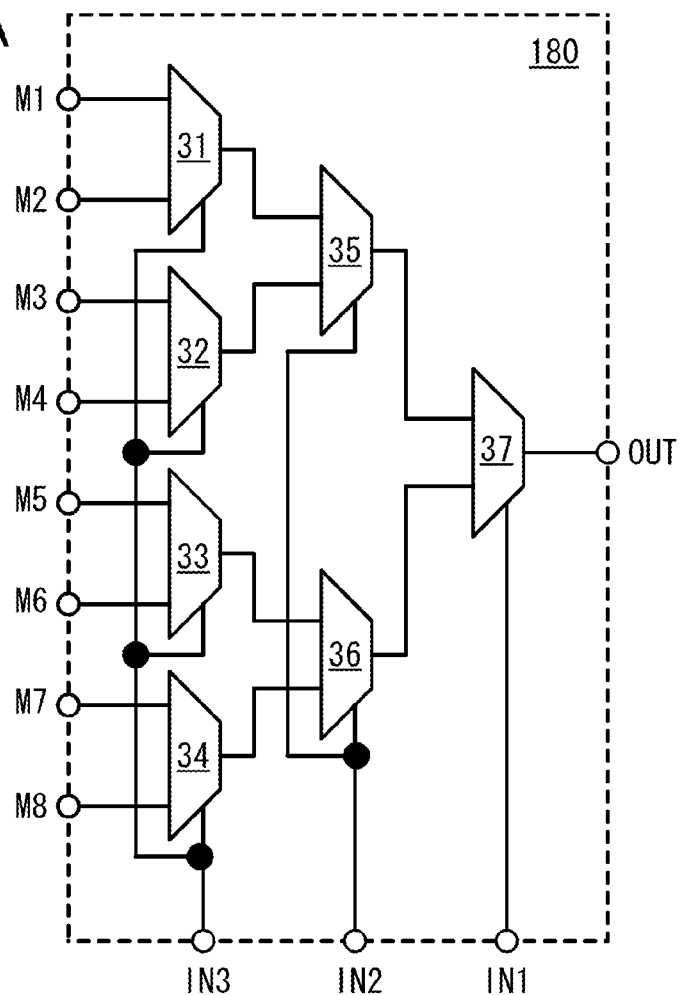
FIGS. 12A to 12C are circuit diagrams of a look-up table.

FIG. 12A illustrates one embodiment of the LUT 180 included in the LE 106. In FIG. 12A, the LUT 180 is composed of seven two-input multiplexers (a multiplexer 31, a multiplexer 32, a multiplexer 33, a multiplexer 34, a multiplexer 35, a multiplexer 36, and a multiplexer 37). Input terminals of the multiplexers 31 to 34 correspond to input terminals M1 to M8 of the LUT 180.

Control terminals of the multiplexers 31 to 34 are electrically connected to each other and correspond to an input terminal IN3 of the LUT 180. Output terminals of the multiplexers 31 and 32 are electrically connected to two input terminals of the multiplexer 35. Output terminals of the multiplexers 33 and 34 are electrically connected to two input terminals of the multiplexer 36. Control terminals of the multiplexers 35 and 36 are electrically connected to each other and correspond to an input terminal IN2 of the LUT 180. Output terminals of the multiplexers 35 and 36 are electrically connected to two input terminals of the multiplexer 37. A control terminal of the multiplexer 37 corresponds to an input terminal IN1 of the LUT 180. An output terminal of the multiplexer 37 corresponds to an output terminal OUT of the LUT 180.

When a potential of the configuration data 105 is input from the memory cell 170 to any of the input terminals M1 to M8 and the input terminals IN1 to IN3, the kind of logic operation performed by the LUT 180 can be determined.

Figure 12B:
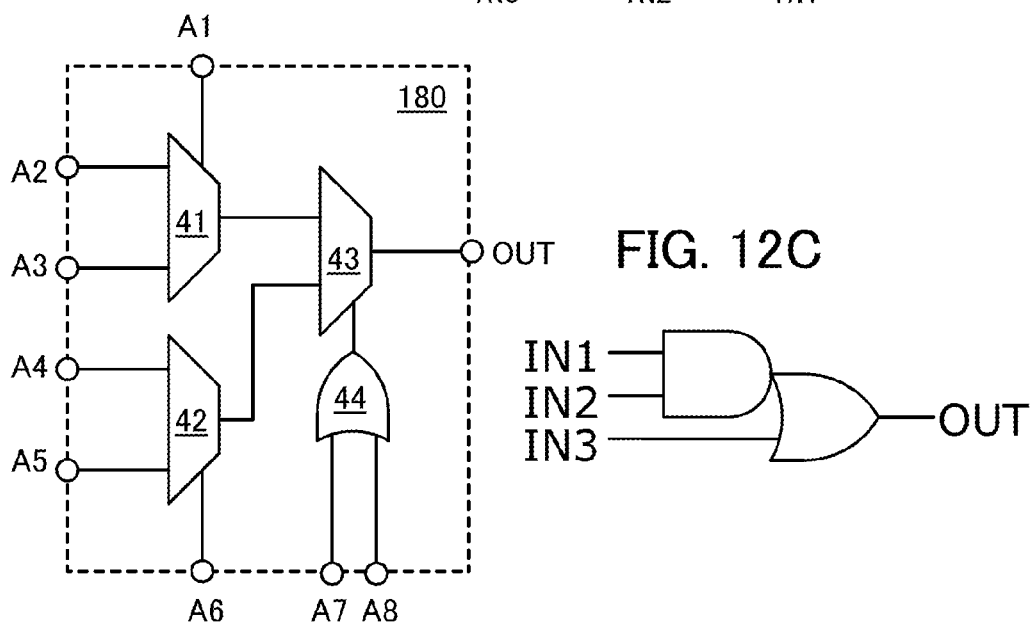
Figure 12C:

For example, in the case where the configuration data 105 has digital values "0", "1", "0", "1", "0", "1", "1", and "1" and the digital values are input to respective input terminals M1 to M8 of the LUT 180 in FIG. 12A, the function of an equivalent circuit in FIG. 12C can be obtained.

In FIG. 12B, the LUT 180 is composed of three two-input multiplexers (a multiplexer 41, a multiplexer 42, and a multiplexer 43) and a two-input OR circuit 44.

Output terminals of the multiplexers 41 and 42 are electrically connected to two input terminals of the multiplexer 43. An output terminal of the OR circuit 44 is electrically connected to a control terminal of the multiplexer 43. An output terminal of the multiplexer 43 corresponds to the output terminal OUT of the LUT 180.

When an output signal corresponding to configuration data stored in a configuration memory is input from the configuration memory to any of a control terminal A1, an input terminal A2, and an input terminal A3 of the multiplexer 41, a control terminal A6, an input terminal A4, and an input terminal A5 of the multiplexer 42, and an input terminal A7 and an input terminal A8 of the OR circuit 44, the kind of logic operation performed by the LUT 180 can be determined.

For example, in the case where an output signal corresponding to configuration data stored in a configuration memory has digital values "0", "1", "0", "0", and "0" and the digital values are input from the configuration memory to respective terminals of the LUT 180 in FIG. 12B: the input terminal A2, the input terminal A4, the input terminal A5, the control terminal A6, and the input terminal A8, the function of the equivalent circuit in FIG. 12C can be obtained. In the above configuration, the control terminal A1, the input terminal A3, and the input terminal A7 correspond to the input terminal IN1, the input terminal IN2, and the input terminal IN3, respectively.

Note that FIGS. 12A and 12B each illustrate an example of the LUT 180 composed of two-input multiplexers; however, the LUT 180 may be composed of multiplexers with three or more inputs.

The LUT 180 may further include any of or all of a diode, a resistor, a logic circuit (or a logic element), and a switch in addition to the multiplexers. As the logic circuit (or the logic element), a buffer, an inverter, a NAND circuit, a NOR circuit, a three-state buffer, a clocked inverter, or the like can be used. As the switch, an analog switch, a transistor, or the like can be used, for example.

Although the case where three-input one-output logic operation as illustrated in FIG. 12C is performed using the LUT 180 illustrated in FIG. 12A or FIG. 12B is described, this embodiment is not limited thereto. When the configuration data 105 to be input are determined as appropriate, logic operation with four or more inputs and two or more outputs can be performed.

Note that not only the logic operation executed by the LE 106 but also the connections between the LEs 106 are determined by the configuration data 105. Specifically, the connections between the LEs 106 are established by a wiring array provided in the logic array 107. The wiring array includes a wiring group including a plurality of wirings and switches for controlling connections between the wirings belonging to the wiring group.

Figure 13A:
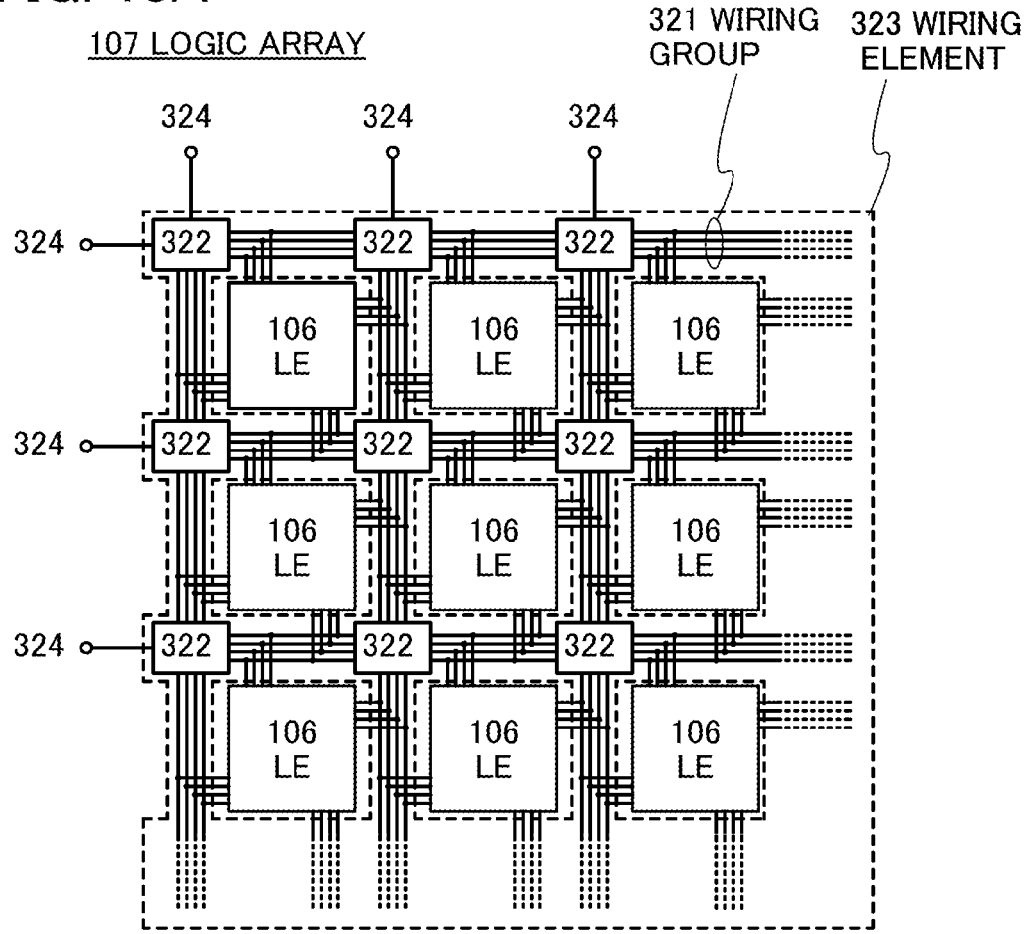
FIGS. 13A and 13B illustrate a configuration of a logic array and a configuration of a switch.

FIG. 13A schematically illustrates, as an example, part of the configuration of the logic array 107. The logic array 107 illustrated in FIG. 13A includes the plurality of the LEs 106, a wiring group 321 connected to any of the plurality of the LEs 106, and switches 322 for controlling connections between the wirings belonging to the wiring group 321. The wiring group 321 and the switches 322 correspond to a wiring element 323. The connections between the wirings controlled by the switches 322 are determined by the configuration data 105.

Figure 13B:
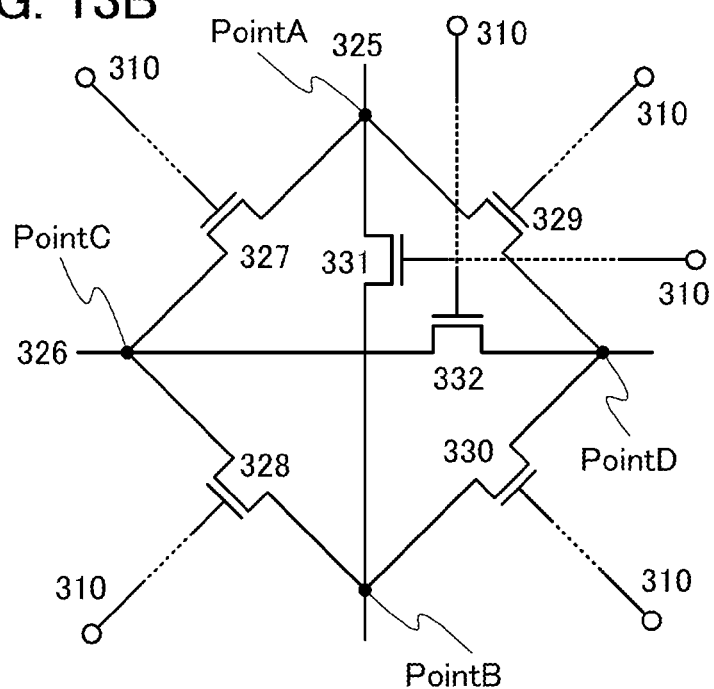

FIG. 13B illustrates a configuration example of the switch 322. The switch 322 illustrated in FIG. 13B has a function of controlling connection structures between a wiring 325 and a wiring 326 which belong to the wiring group 321. Specifically, the switch 322 includes transistors 327 to 332. The transistor 327 has a function of controlling electrical connection between a point A of the wiring 325 and a point C of the wiring 326. The transistor 328 has a function of controlling electrical connection between a point B of the wiring 325 and the point C of the wiring 326. The transistor 329 has a function of controlling electrical connection between the point A of the wiring 325 and a point D of the wiring 326. The transistor 330 has a function of controlling electrical connection between the point B of the wiring 325 and the point D of the wiring 326. The transistor 331 has a function of controlling electrical connection between the point A and the point B of the wiring 325. The transistor 332 has a function of controlling electrical connection between the point C and the point D of the wiring 326.

The transistors 327 to 332 are turned (switched) on or off depending on the potential of the configuration data 105 applied to gate electrodes 310 of the transistors 327 to 332.

The switches 322 also have a function of controlling electrical connection between the wiring group 321 and output terminals 324 of the logic array 107.

Embodiment 2

The semiconductor device of one embodiment of the present invention can be used for display devices, personal computers, and image reproducing devices provided with recording media (typically, devices that reproduce the content of recording media such as digital versatile discs (DVDs) and have displays for displaying the reproduced images). Other examples of electronic devices that can include the semiconductor device of one embodiment of the present invention are mobile phones, game machines including portable game consoles, portable information terminals, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 14A to 14D illustrate specific examples of these electronic devices.

Figure 14A:
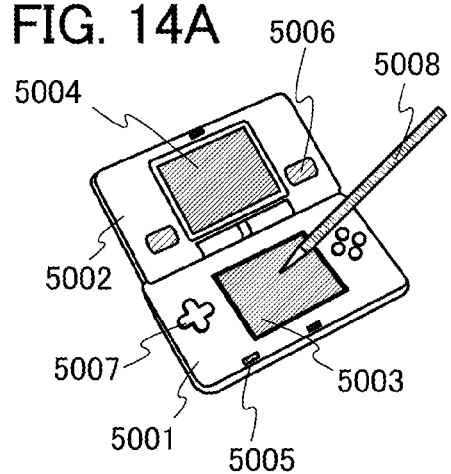
FIGS. 14A to 14D each illustrate an electronic device.

FIG. 14A illustrates a portable game console including a housing 5001, a housing 5002, a display portion 5003, a display portion 5004, a microphone 5005, speakers 5006, operation keys 5007, a stylus 5008, and the like. Note that although the portable game console illustrated in FIG. 14A includes the two display portions 5003 and 5004, the number of display portions included in the portable game console is not limited to two.

Figure 14B:
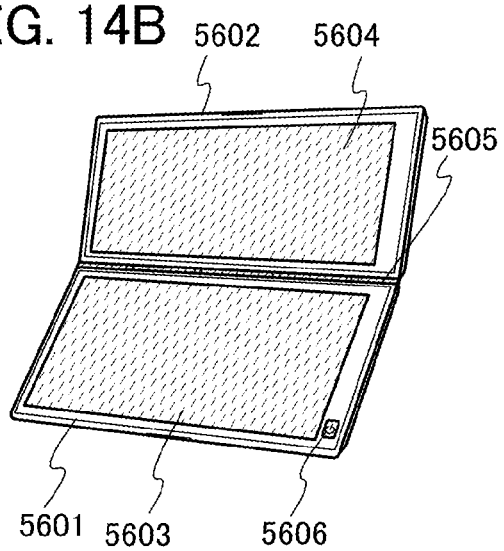

FIG. 14B illustrates a portable information terminal including a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. Images displayed on the first display portion 5603 may be switched in accordance with the angle between the first housing 5601 and the second housing 5602 at the joint 5605. A display device with a position input function may be used as at least one of the first display portion 5603 and the second display portion 5604. Note that the position input function can be added by provision of a touch panel in a display device. Alternatively, the position input function can be added by provision of a photoelectric conversion element called a photosensor in a pixel area of a display device.

Figure 14C:
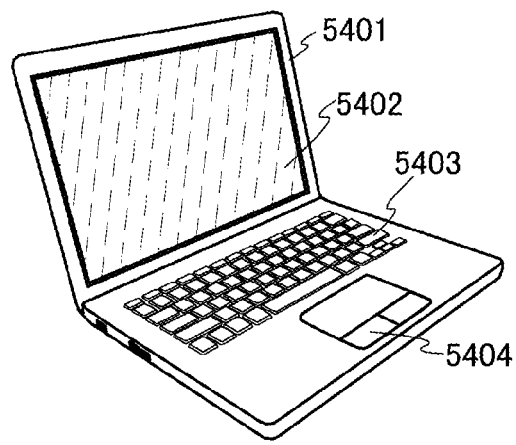

FIG. 14C illustrates a notebook computer including a housing 5401, a display portion 5402, a keyboard 5403, a pointing device 5404, and the like.

Figure 14D:
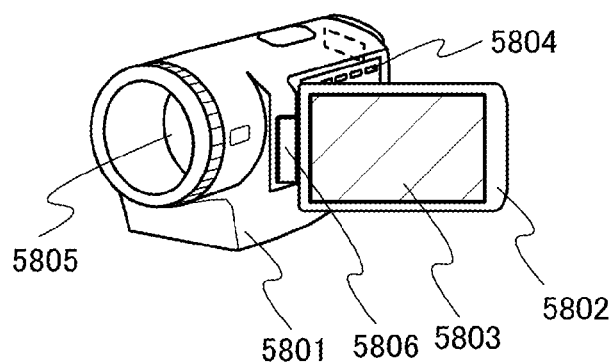

FIG. 14D illustrates a video camera including a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and an angle between the first housing 5801 and the second housing 5802 can be changed with the joint 5806. Images displayed on the display portion 5803 may be switched in accordance with the angle at the joint 5806 between the first housing 5801 and the second housing 5802.

This embodiment can be implemented in combination with the other embodiment as appropriate.

This application is based on Japanese Patent Application serial no. 2012-104282 filed with Japan Patent Office on Apr. 30, 2012, the entire contents of which are hereby incorporated by reference.

What is claimed is:

1. A semiconductor device comprising:
a storage device storing a plurality of application programs and a plurality of configuration data items related to the plurality of application programs;
a processor comprising a function of executing a first thread in the plurality of application programs; and
a programmable logic device comprising:
a memory module;
a memory element storing a plurality of configuration data items selected by the memory module from the plurality of configuration data items in the storage device; and
a plurality of logic elements defining a logic circuit in accordance with the plurality of configuration data items in the memory element, wherein the logic circuit executes a second thread in the plurality of application programs,
wherein the memory module comprises a function of counting the number of times the plurality of configuration data items are used to define the logic circuit and a function of selecting the plurality of configuration data items in the memory element in accordance with the number of times, and
wherein the memory element comprises a plurality of memory cells each comprising a storage element and a switch used for supplying charge whose amount is determined by the plurality of configuration data items in the memory element to the storage element, retaining the charge in the storage element, and discharging the charge from the storage element.

2. The semiconductor device according to claim 1, wherein the storage element is a transistor or a capacitor.

3. The semiconductor device according to claim 1, wherein the switch comprises a transistor including an oxide semiconductor in a channel formation region.

4. The semiconductor device according to claim 1, wherein the switch comprises a transistor including an oxide semiconductor containing In, Ga, and Zn in a channel formation region.

5. A semiconductor device comprising:
a storage device storing a plurality of application programs and a plurality of configuration data items related to the plurality of application programs;
a processor comprising a function of executing a first thread in the plurality of application programs; and
a programmable logic device comprising:
a memory module;
a memory element storing a plurality of configuration data items selected by the memory module from the plurality of configuration data items in the storage device; and
a plurality of logic elements defining a logic circuit in accordance with the plurality of configuration data items in the memory element, wherein the logic circuit executes a second thread in the plurality of application programs,
wherein the memory module comprises a function of obtaining data items on time at which the logic circuit is defined and a function of selecting the plurality of configuration data items in the memory element in accordance with the data items on the time, and
wherein the memory element comprises a plurality of memory cells each comprising a storage element and a switch used for supplying charge whose amount is determined by the plurality of configuration data items in the memory element to the storage element, retaining the charge in the storage element, and discharging the charge from the storage element.

6. The semiconductor device according to claim 5, wherein the storage element is a transistor or a capacitor.

7. The semiconductor device according to claim 5, wherein the switch comprises a transistor including an oxide semiconductor in a channel formation region.

8. The semiconductor device according to claim 5, wherein the switch comprises a transistor including an oxide semiconductor containing In, Ga, and Zn in a channel formation region.

* * * * *